(12) United States Patent
Durec et al.

(10) Patent No.: US 6,487,395 B1
(45) Date of Patent: Nov. 26, 2002

(54) RADIO FREQUENCY ELECTRONIC SWITCH

(75) Inventors: Jeffrey C. Durec, Chandler, AZ (US); David Kevin Lovelace, Chandler, AZ (US); Mark D. Randol, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 469 days.

(21) Appl. No.: 09/039,502

(22) Filed: Mar. 16, 1998

(51) Int. Cl.$^7$ .................................................. H04Q 7/20
(52) U.S. Cl. .......................................... 455/78; 455/83
(58) Field of Search .............................. 455/78, 83, 82, 455/84, 93; 343/777, 876, 904; 333/101, 103, 104, 262; 335/2; 327/61, 109, 374, 502, 503

(56) References Cited

U.S. PATENT DOCUMENTS

| | | | | |
|---|---|---|---|---|
| 4,565,961 A | * | 1/1986 | Hornak et al. ............... 323/312 |
| 4,742,249 A | * | 5/1988 | Alpaiwalla et al. ......... 327/484 |
| 4,883,984 A | * | 11/1989 | Kess ........................... 327/503 |
| 5,446,370 A | * | 8/1995 | Voight .................... 340/825.79 |
| 5,521,560 A | * | 5/1996 | Burns et al. ................. 333/262 |
| 5,541,554 A | * | 7/1996 | Stengel et al. ................ 455/93 |
| 5,548,248 A | * | 8/1996 | Wang .......................... 330/288 |
| 5,710,984 A | * | 1/1998 | Millard et al. ................ 455/90 |
| 5,789,995 A | * | 8/1998 | Minasi ........................ 327/503 |

* cited by examiner

Primary Examiner—Dwayne Bost
Assistant Examiner—Jean A Gelin
(74) Attorney, Agent, or Firm—Michael D. Bingham; Lanny L. Parker

(57) ABSTRACT

A radio frequency (RF) switch (40) for use in a wireless communication system operated in a time delay division mode of operation. The switch includes a pair of PIN diodes (54 and 56) serially coupled between the transmitter and receiver paths of the communication system which share a common node (58) to which a bias voltage is provided. The bias voltage is switched between first and second voltage levels to alternately cause one and the other of the pin diodes to be forward biased while the other is reversed bias. In this manner the transmitter and receiver paths will be alternately shorted to alternating current ground while the other path is shorted to a common node to an antenna.

17 Claims, 1 Drawing Sheet

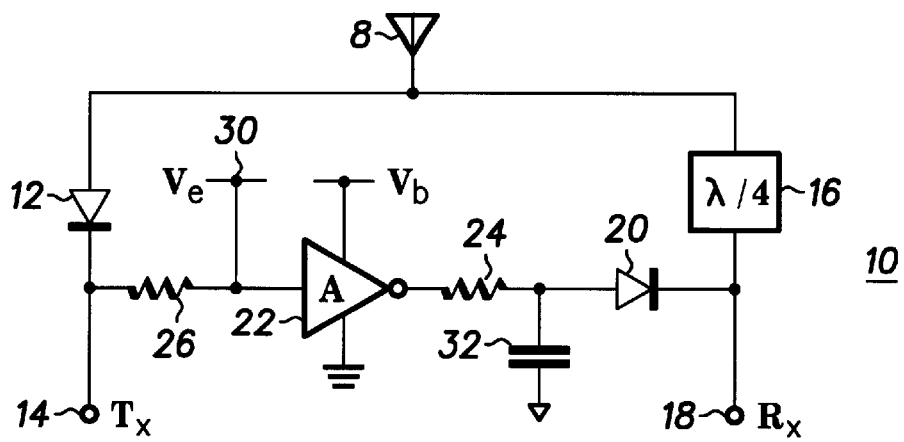
FIG. 1 *- PRIOR ART -*
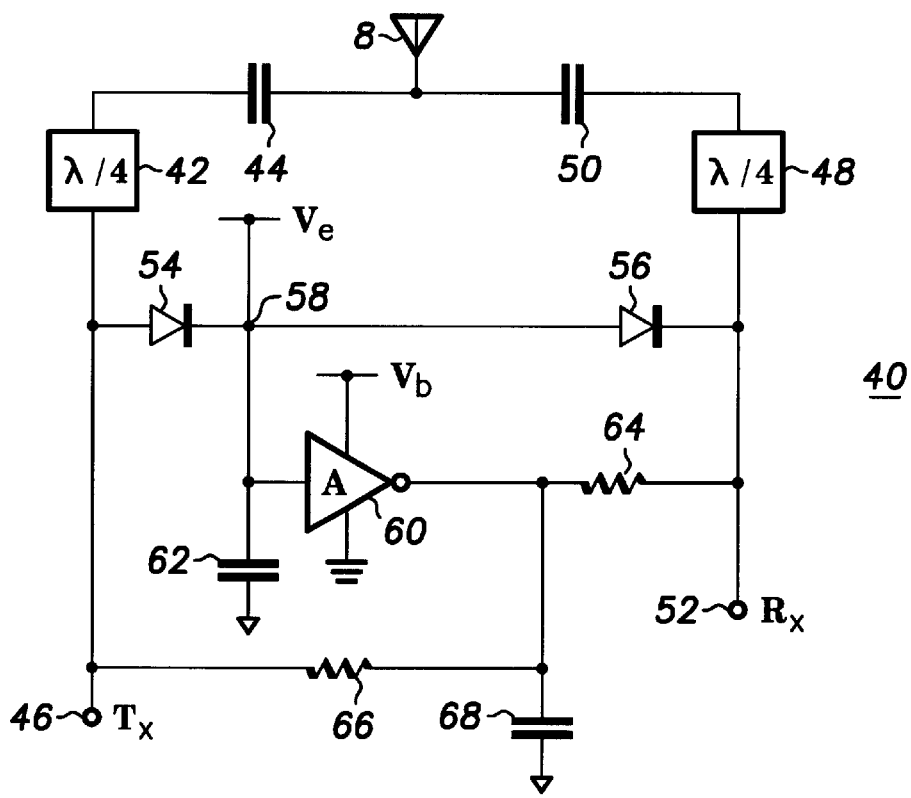
FIG. 2

RADIO FREQUENCY ELECTRONIC SWITCH

BACKGROUND OF THE INVENTION

The present invention relates to Radio Frequency (RF) electronic switches and, more particularly, to a RF switch for use in time division duplex (TDD) wireless communication systems.

Wireless communication systems such as 900 MHz cordless telephones often use a TDD methodology which allows the transmitter path of the telephone to be isolated from the receiver during the receive mode of operation and, likewise, isolate the receiver from the transmit path during the transmit mode.

One method that has been used to provide isolation uses four gallium arsenide switches arranged between the antenna and the transmit and receive paths of the wireless communication system. The four switches are controlled by a logic signal to be selectively opened or closed whereby the transmit path is both shorted to an alternating current ground and open-circuited to the antenna during the receive mode of operation while the receive path is directly connected to the antenna and vice versus. In this manner the receiver signal is coupled to the receiver circuitry of the system during the receive mode. The transmitter signal is isolated from the receiver signal path thereby being inhibited from desensitizing the receiver; wherein desensitizing refers to a large magnitude unwanted signal presence that limits the minimum detectable signal strength of the desired received signal. A major drawback of this technique is the significant cost of the gallium arsenide switches.

Hence, a need arises for reducing the manufacturing costs in wireless telephone communication systems while providing adequate isolation between the receiver and transmitter thereof.

BRIEF DESCRIPTION OF THE DRAWINGS

FIG. 1 is schematic diagram of a prior art RF switch circuit used in a wireless communication system; and FIG. 2 is a schematic diagram of a RF switch circuit in accordance with the preferred embodiment.

DETAILED DESCRIPTION OF THE PREFERRED EMBODIMENT

Referring now to FIG. 1, there is shown a prior art RF switch circuit 10 that uses a PIN diode approach which is much cheaper to implement than the previously mentioned gallium arsenide switching arrangement. As illustrated the antenna 8 of the wireless communication system is coupled via PIN diode 12 in the transmit path to the transmitter (Tx) at node 14. Similarly, antenna 8 is also coupled to the receiver (Rx) via an impedance transformation circuit 16 at node 18. A second PIN diode 20 is coupled between nodes 14 and 18 via inverter amplifier 22 and resistors 24 and 26. A bias voltage Ve is applied at pin 30 the latter of which is connected between resistor 26 and inverter 22 which, as will be described, provides switching between the receiver RX and transmitter Tx modes of operation. Alternating current (AC) ground for the system is provided via capacitor 32 which is connected between resistor 24 and diode 20 to AC ground. Further more, the antenna connection, Tx and Rx nodes are assumed to be fifty (50) ohm characteristic impedance ports although any arbitrary characteristic impedance may be used.

During operation, when Ve is at a low voltage level, for example 0.0 volts, diodes 12 and 20 are forward biased and act as short circuits. The RF switch 10 is then in the transmit (TX) mode and node 14 is shorted to antenna 8 to pass the transmitter signal thereto while the receive path at node 18 is shorted to AC ground via capacitor 32. The impedance transformation circuit 16, which may be any ninety degree phase shift circuit, for example a quarter-wavelength transmission line at the frequency of operation of the communication system, transforms the short circuit appearing at node 18, via diode 20, to an open or infinite impedance at antenna 8. Thus, the short circuit does not load the antenna 8. Likewise, when Ve is high, for example 3.0 volts, diodes 12 and 20 are reverse biased by an amount of Vb/2 and act as open circuits. The transmitter signal is thereby blocked from antenna 8 while the receive signal appearing at antenna 8 is passed through impedance transformation circuit 16 to the receiver coupled to node 18. RF switch 10 is therefore in the receive mode of operation.

While RF switch circuit 10 is more economical to manufacturer than switching circuits utilizing gallium arsenide switches due to the use of PIN diodes 12 and 20, it does have some disadvantages. For instance, since diodes 12 and 20 do not share a common node they have to be in separate packages which increases the costs associated with RF switch circuit 10. Several other problems may be associated with RF switch circuit 10 while it is in the receive mode of operation due to the fact that diodes 12 and 20 are reverse biased by only Vb/2 as described above. For example, the RF voltage signal applied at antenna 8 may exceed Vb/2 which would cause diodes 12 and 20 to forward bias resulting unacceptable inter modulation making data non-interpretable. Moreover, while in the receive mode, the parasitic capacitance of diode 12 associated therewith as it is reverse biased is low enough typically to permit the RF transmitter signal to leak through the diode into the receiver path. This will cause desensitization, possibly an overload of the receiver coupled to node 18. Furthermore, during the transmit mode the capacitance associated with diode 12 is not linear for high transmitter power signals and may cause distortion and inter modulation problems in RF switch circuit 10.

Turning now to FIG. 2, there is shown RF switch circuit 40 of the preferred embodiment which overcomes the problems of the prior art circuit of FIG. 1 and is also more economical to manufacture than RF switching circuits utilizing gallium arsenide switches.

RF switch circuit 40 includes a transmit path coupled between a common antenna node to which antenna 8 is connected and a transmitter at transmit (Tx) node 46 and a receive path coupled between the common antenna node and a receiver at receive (Rx) node 52. More particularly, the transmit path includes impedance transformation circuit 42 and capacitor 44 serially coupled between antenna 8 and node 46 while the receive path includes impedance transformation circuit 48 and capacitor 50 serially coupled between antenna 8 and node 52. A switching arrangement is illustrated for operating RF switch 40 in a TDD mode comprising PIN diodes 54 and 56, acting as semiconductor switches, serially coupled between nodes 46 and 52 and having a commonly shared node 58 at which is provided biasing voltage $V_E$. Also included in the switching arrangement is circuitry for alternatively connecting the diodes 54 and 56 to AC ground including inverter amplifier 60 the input of which is coupled to node 58 and capacitor 62 the latter of which provides AC ground while the output of inverter 60 is coupled to AC ground via capacitor 68 and through resistors 64 and 66 respectively to nodes 52 and 46. As previously mentioned, the cathode (second electrode) of diode 54 is connected in common with the anode (first electrode) of diode 56 with the anode (first electrode) of diode 54 and the cathode (second electrode) of diode 56 being respectively coupled to nodes 46 and 52. Since diodes 54 and 56 share a common node they can be placed in a single three terminal package which provides a significant cost reduction over the single package diodes of FIG. 1. Again, impedance transformation circuits 42 and 48, although shown as quarter-wavelength transmission lines may be realized by any ninety degree phase shifting network.

In operation, with $V_E$ at a high voltage level, e.g. 3.0 volts, RF switch 40 is placed in a transmit mode as diode 56 is forward biased and shorts the receiver, coupled to node 52, to AC ground via capacitor 62. Diode 54 is reversed biased and therefore acts as an open circuit whereby the transmitter signal is passed through impedance transformation circuit 42 and capacitor 44 to antenna without the antenna being loaded down by the switching arrangement circuitry. Likewise, diode 56 being forward biased acts as a short circuit whereby the AC ground is transformed through impedance transformation circuit 48, i.e., a quarter wavelength transmission line at the RF frequency to place an open or infinite impedance at antenna 8 whereby the receive path does not load the antenna. Additionally, the capacitance of capacitor 62 is utilized to resonate out the parasitic inductance of the PIN diode package containing diodes 54 and 56 to improve the isolation characteristics of RF switch circuit 40.

Several advantages are obtained by RF switch 40 over the prior art circuit in the transmit mode. Namely, as diode 54 is reverse biased by the full amount of the supply voltage $V_E$ while the receiver is shorted to ground the RF transmitter signal power can not turn the diode on which provides better isolation. Additionally any leakage through diode 54 due to its parasitic capacitance while being reverse biased is shorted to AC ground via capacitor 62.

In the receive mode of operation $V_E$ is placed at a low voltage level, i.e. zero volts, such that diode 54 is forward biased to short the transmitter signal at node 46 to AC ground via capacitor 62. Simultaneously diode 56 is reverse biased by the full supply voltage and acts as an open circuit to the receive path whereby the RF receive signal at antenna is coupled via impedance transformation circuit 48 to the receiver at node 52. Similarly, impedance transformation circuit 42 being a quarter wavelength transmission line at the RF signal frequency transforms the AC short, via diode 54, to an infinite impedance as seen by antenna 8 to inhibit any loading by the transmit path during the receive mode of operation.

It is considered obvious to one skilled in the art that the input and output of inverter 60 could be reversed with $V_e$ being coupled to the common connection between resistors 64 and 66 whereby a bias voltage is still provided to the common node of diodes 54 and 56 such that RF switch 40 would still perform in the manner described above as $V_e$ is switched between high and low voltage levels.

Thus, what has been described above is a novel RF switch circuit for use in time division duplex wireless communication systems in which the switch provides switching between transmit and receive paths. The switch circuit includes a pair of pin diodes having a common node which permits packaging of the diodes in a single package to reduce costs over other prior art circuits. In addition, the diodes are not located in either the transmit or receive paths of the communication system which reduces or inhibits distortion and inter modulation problems suffered in the prior art.

What is claimed is:

1. In a communication system having both a transmit path and a receive path coupled to an common antenna node for transmitting and receiving respectively a radio frequency (RF) signal there at in a duplex mode of operation, a RF switch circuit, comprising;
    an impedance transformation circuit in the transmit path coupled between the common antenna node and a transmitter node;
    an impedance transformation circuit in the receiver path coupled between the common antenna node and a receiver node;
    first and second diodes serially coupled between said transmitter node and said receiver node and having a common node there between to which a bias voltage is supplied from a terminal, said bias voltage being switched between first and second voltage levels in the duplex mode of operation; and
    additional circuitry coupled between said common node, said transmitter node, and said receiver node, said additional circuitry providing an alternating current ground at said common node to which said transmitter and receiver nodes are alternatively coupled during said duplex mode of operation.

2. The RF switch of claim 1 wherein said additional circuitry includes:
    a capacitor coupled between said common node and said alternating current ground: and
        an inverter amplifier having an input coupled to said common node and an output coupled both to said transmitter node and said receiver node.

3. The RF switch of claim 2 including a first resistor coupled between said output of said inverter amplifier and said transmitter node and a second resistor coupled between said output of said inverter amplifier and said receiver node.

4. The RF switch of claim 3 including an additional capacitor coupled between said output of said inverter amplifier and said alternating current ground.

5. The RF switch of claim 4 wherein:
    said first diode is a PIN diode having a first electrode coupled to said transmitter node and a second electrode coupled to said common node; and
    said second diode is a PIN diode having a first electrode coupled to said common node and a second electrode coupled to said receiver node.

6. The RF switch of claim 5 further including said first diode being reverse biased with said second diode being forward biased when said bias voltage is at said first voltage level thereby shorting said receiver node to said alternating current ground while said transmitter node is coupled to the antenna, and said first diode being forward biased with said second diode being reverse biased when said bias voltage is at said second voltage level thereby shorting said transmitter node to alternating ground and while said receiver node is coupled to the antenna.

7. A current switch for use in a RF communication system to alternately couple first and second nodes to a common node, comprising:
    a first impedance transformation circuit coupled between the first node and the common node;
    a second impedance transformation circuit coupled between the second node and the common node;

a first semiconductor switch coupled between the first node and a common bias node;

a second semiconductor switch coupled between said common bias node and the second node;

a bias voltage supplied from a terminal to said common bias node for switching between first and second voltage levels; and a capacitance coupled between said common bias node and alternating current ground.

8. The current switch of claim 7 further including said first semiconductor switch being reverse biased and said second semiconductor switch being forward biased when said bias voltage is at said first voltage level thereby shorting the second node to alternating current ground while the first node is coupled to the common node, and said first semiconductor switch being forward biased and said second semiconductor switch being reverse biased when said bias voltage is at said second voltage level thereby shorting the first node to alternating current ground while the second node is coupled to the common node.

9. The current switch of claim 7 including an inverter amplifier having an input coupled to said common bias node and an output coupled both to the first and second nodes.

10. The current switch of claim 9 wherein the first and second semiconductor switches are PIN diodes and said voltage supply is connected to said common bias node.

11. The current switch of claim 10 wherein said first and second impedance transformation circuits include quarter wavelength transmission lines at the frequency of operation of the RF communication system.

12. The current switch of claim 11 wherein said first and second PIN diodes reside in a single package.

13. The current switch of claim 12 wherein said capacitance is resonant with the parasitic inductance of said single package at the frequency of operation of the current switch.

14. The current switch of claim 10 including a first resistor coupled between said output of said inverter amplifier and the first node and a second resistor coupled between said output of said inverter amplifier and the second node.

15. The current switch of claim 7 including an inverter amplifier having an input and an output, said input being coupled both to the first node and the second node, and said output being coupled to said common bias node.

16. The current switch of claim 15 wherein the first and second semiconductor switches are PIN diodes and said voltage supply is connected to said input of said inverter amplifier.

17. The current switch of claim 16 including a first resistor coupled between said output of said inverter amplifier and the first node and a second resistor coupled between said output of said inverter amplifier and the second node.

* * * * *